(12) United States Patent
He

(10) Patent No.: US 11,263,957 B2
(45) Date of Patent: Mar. 1, 2022

(54) DISPLAY DEVICE AND METHOD FOR DRIVING THE SAME

(71) Applicant: WuHan TianMa Micro-electronics CO., LTD., Wuhan (CN)

(72) Inventor: Yuqian He, Wuhan (CN)

(73) Assignee: WUHAN TIANMA MICRO-ELECTRONICS CO., LTD., Wuhan (CN)

(*) Notice: Subject to any disclaimer, the term of this patent is extended or adjusted under 35 U.S.C. 154(b) by 167 days.

(21) Appl. No.: 16/826,076

(22) Filed: Mar. 20, 2020

(65) Prior Publication Data

US 2021/0201762 A1 Jul. 1, 2021

(30) Foreign Application Priority Data

Dec. 25, 2019 (CN) .......................... 201911355105.8

(51) Int. Cl.
  *G09G 3/32* (2016.01)
  *H01L 33/24* (2010.01)
  *H01L 31/12* (2006.01)

(52) U.S. Cl.
  CPC ............ *G09G 3/32* (2013.01); *H01L 31/125* (2013.01); *H01L 33/24* (2013.01); *G09G 2310/027* (2013.01); *G09G 2310/0286* (2013.01)

(58) Field of Classification Search
  CPC ............... G09G 3/32; G09G 2310/027; G09G 2310/0286; G09G 3/2074; G09G 3/3275; G09G 3/3266; G09G 2300/0426; H01L 31/125; H01L 33/24; H01L 27/3234; H01L 27/156; H01L 27/3248; H01L 27/3276
  See application file for complete search history.

(56) References Cited

U.S. PATENT DOCUMENTS

| | | | |
|---|---|---|---|
| 2017/0154947 A1* | 6/2017 | Nakamura | H01L 51/5275 |
| 2019/0164995 A1* | 5/2019 | Lee | H01L 27/3276 |
| 2019/0312090 A1* | 10/2019 | Park | G06F 1/1658 |
| 2020/0302860 A1* | 9/2020 | Kim | G09G 3/3266 |
| 2020/0312926 A1* | 10/2020 | Bae | H01L 27/3262 |
| 2021/0083221 A1* | 3/2021 | Lee | H01L 27/3248 |

FOREIGN PATENT DOCUMENTS

| | | |
|---|---|---|
| CN | 204557958 U | 8/2015 |
| CN | 109148537 A | 1/2019 |

* cited by examiner

*Primary Examiner* — Andrew Sasinowski

(74) *Attorney, Agent, or Firm* — Christensen O'Connor Johnson Kindness PLLC

(57) ABSTRACT

Provided is a display device including: a display panel; and a driving chip. The display panel includes: sub-pixels including first sub-pixels and second sub-pixels located, each first sub-pixel including a first pixel circuit and a first light-emitting element, and each second sub-pixel including a second light-emitting element. The driving chip includes: a data signal output module electrically connected to the first pixel circuit and configured to output a first data signal to the first pixel circuit, so that the first pixel circuit outputs, in response to the first data signal, a first driving current signal for driving the first light-emitting element to emit light; and a driving current signal output module electrically connected to the second light-emitting element and configured to output a second driving current signal to the second light-emitting element, so that the second light-emitting element emits light in response to the second driving current signal.

23 Claims, 11 Drawing Sheets

DISPLAY DEVICE AND METHOD FOR DRIVING THE SAME

CROSS-REFERENCE TO RELATED APPLICATIONS

The present application claims the benefit of priority to Chinese Patent Application No. 201911355105.8, filed on Dec. 25, 2019, the content of which is incorporated herein by reference in its entirety.

TECHNICAL FIELD

The present disclosure relates to the field of display technologies, and in particular, to a display device and a method for driving the display device.

BACKGROUND

A display device having an imaging function includes a display panel and a camera. The display panel is provided with an optical component arrangement area, and an arrangement position of the optical component arrangement area corresponds to that of the camera. Currently, a number of metal wires in the optical component arrangement area is reduced usually by reducing a pixel density of the optical component arrangement area, thereby increasing light transmittance of the optical component arrangement area. However, with such configuration, if the light transmittance of the optical component setting area needs to be increased to a greater degree, the pixel density in the optical component setting area has to be very small, resulting an excessively large different between the pixel density of the optical component arrangement area and a pixel density of a conventional display area, thereby leading to an effect on overall image display by the optical component arrangement area. If it is needed to reduce the effect on display by the optical component arrangement area, the pixel density of the optical component arrangement area cannot be too small. This will result in low light transmittance of the optical component arrangement area, thereby affecting an imaging effect.

SUMMARY

In view of this, the present disclosure provides a display device and a method for driving the display device, which can not only effectively increase the light transmittance of the optical component arrangement area, but also alleviate the effect on an overall display image by the optical component arrangement area.

In an aspect, an embodiment of the present disclosure provides a display device. In an embodiment, the display device includes a display panel and at least one driving chip. In an embodiment, the display panel may have a display area and a non-display area surrounding the display area. In an embodiment, the display area includes a first display area and an optical component arrangement area. In an embodiment, the display panel further include: a plurality of sub-pixels including first sub-pixels located in the first display area and second sub-pixels located in the optical component arrangement area. In an embodiment, each of the first sub-pixels include a first pixel circuit and a first light-emitting element that are electrically connected to each other, and each of the second sub-pixels including a second light-emitting element. In an embodiment, the at least one driving chip includes: a data signal output module electrically connected to the first pixel circuit and configured to output a first data signal to the first pixel circuit, so that the first pixel circuit outputs, in response to the first data signal, a first driving current signal for driving the first light-emitting element to emit light; and a driving current signal output module electrically connected to the second light-emitting element and configured to output a second driving current signal to the second light-emitting element, so that the second light-emitting element emits light in response to the second driving current signal.

In another aspect, an embodiment of the present disclosure provides a method for driving the display device described above. In an embodiment, the method include steps of: providing, by the data signal output module of the at least one driving chip, the first data signal to the first pixel circuit, so that the first pixel circuit drives, in response to the first data signal, the first light-emitting element to emit light; and providing, by the driving current signal output module of the at least one driving chip, the second driving current signal to the second light-emitting element, so that the second light-emitting element emits light in response to the second driving current signal.

One or more of the above technical solutions has the following beneficial effects.

In the technical solution provided by the embodiments of the present disclosure, by providing the driving current signal output module in the driving chip, it is possible to use the driving current signal output module to simulate a pixel circuit for directly outputting the second driving current signal to the second light-emitting element. That is, the second sub-pixel in the optical component arrangement area does not need to be provided with a pixel circuit, and only the second light-emitting element, which is electrically connected to the driving current signal output module, is needed. It can be seen that, with the technical solution provided by the embodiments of the present disclosure, the number of metal wires arranged in the optical component arrangement area can be greatly reduced, thereby effectively increasing the light transmittance of the optical component arrangement area. Thus, an amount of external ambient light incident to the camera via the optical component arrangement area is increased, and an imaging quality is improved. Moreover, with a goal of achieving high light transmittance of the optical component arrangement area, a number of second light-emitting elements arranged in the optical component arrangement area is increased, which is equivalent to that a pixel density of second sub-pixels in the optical component arrangement area is increased, thereby effectively reducing a difference between the pixel density in the optical component arrangement area and the pixel density in the first display area. In this way, an effect on the overall image display by the optical component arrangement area can be alleviated, and thus the display effect can be improved.

BRIEF DESCRIPTION OF DRAWINGS

In order to more clearly illustrate technical solutions in embodiments of the present disclosure, the accompanying drawings used in the embodiments are briefly introduced as follows. It should be noted that the drawings described as follows are merely part of the embodiments of the present disclosure, other drawings can also be acquired by those skilled in the art without paying creative efforts.

DESCRIPTION OF EMBODIMENTS

For better illustrating technical solutions of the present disclosure, embodiments of the present disclosure will be described in detail as follows with reference to the accompanying drawings.

It should be noted that, the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

Figure 1:
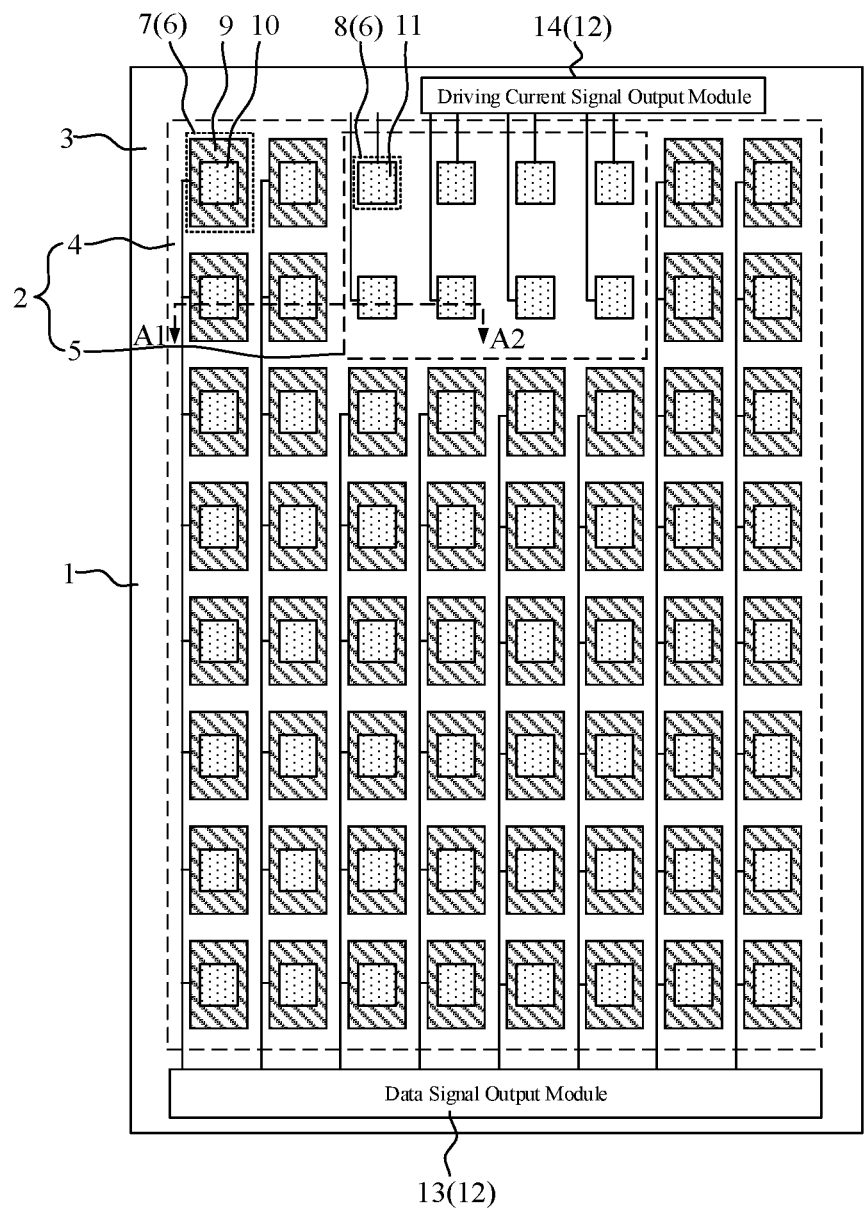
FIG. 1 is a schematic diagram of a structure of a display device according to an embodiment of the present disclosure.
Figure 2:
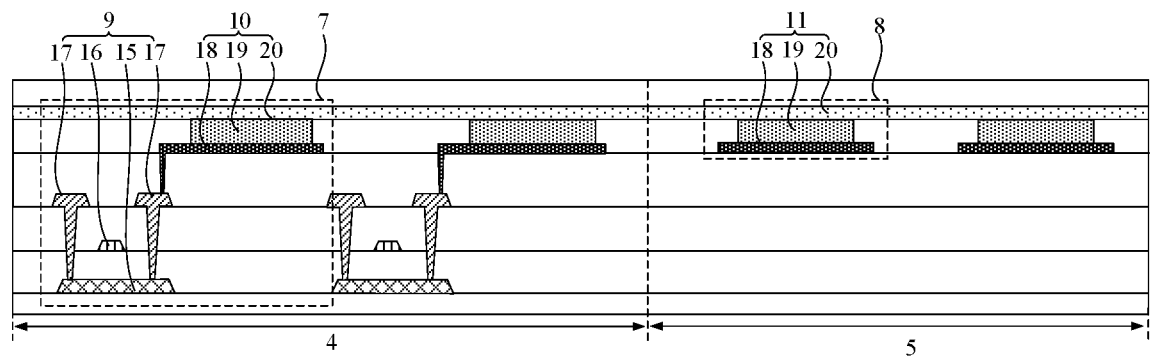
FIG. 2 is a cross-sectional view along A1-A2 of FIG. 1.

FIG. 1 is a schematic diagram of a structure of a display device according to an embodiment of the present disclosure, and FIG. 2 is a cross-sectional view along A1-A2 of FIG. 1. As shown in FIG. 1 and FIG. 2, an embodiment of the present disclosure provides a display device. The display device includes a display panel 1. The display panel 1 has a display area 2 and a non-display area 3 surrounding the display area 2. The display area 2 includes a first display area 4 and an optical component arrangement area 5. The display area 2 is provided with a plurality of sub-pixels 6, including first sub-pixels 7 and second sub-pixels 8. The first sub-pixels 7 are located in the first display area 4, and the second sub-pixels 8 are located in the optical component arrangement area 5. The first sub-pixel 7 includes a first pixel circuit 9 and a first light-emitting element 10 that are electrically connected to each other, and the second sub-pixel 8 includes a second light-emitting element 11.

The display device further includes a driving chip 12. The driving chip 12 includes a data signal output module 13 and a driving current signal output module 14. The data signal output module 13 is electrically connected to the first pixel circuit 9. The data signal output module 13 is configured to output a first data signal to the first pixel circuit 9, so that the first pixel circuit 9 drives, in response to the first data signal, the first light-emitting element 10 to emit light. The driving current signal output module 14 is electrically connected to the second light-emitting element 11, and the driving current signal output module 14 is configured to output a second driving current signal to the second light-emitting element 11, so that the second light-emitting element 11 emits light in response to the second driving current signal.

While driving the first sub-pixel 7 to emit light, the data signal output module 13 outputs the first data signal to the first pixel circuit 9, and the first pixel circuit 9 outputs, in response to the first data signal, the first driving current signal to the first light-emitting element 10, so that the first light-emitting element 10 emits light in response to the first driving current signal. While driving the second sub-pixel 8 to emit light, the driving current signal output module 14 directly outputs the second driving current signal to the second light-emitting element 11, so that the second light-emitting element 11 emits light in response to the second driving current signal.

In the display device provided by this embodiment of the present disclosure, by providing the driving current signal output module 14 in the driving chip 12, the driving current signal output module 14 can be used to simulate a pixel circuit for directly outputting the second driving current signal to the second light-emitting element 11. That is, the second sub-pixel 8 in the optical component arrangement area 5 does not need to be provided with a pixel circuit, but only the second light-emitting element 11 which is electrically connected to the driving current signal output module 14 is needed. It can be seen that, with the display device provided by this embodiment of the present disclosure, the number of metal wires arranged in the optical component arrangement area 5 can be greatly reduced, thereby effectively increasing the light transmittance of the optical component arrangement area 5. Thus, an amount of external ambient light incident to the camera via the optical component arrangement area 5 is increased, and an imaging quality is improved. Moreover, with a goal of achieving high light transmittance of the optical component arrangement area 5, a number of second light-emitting elements 11 arranged in the optical component arrangement area 5 is increased. This is equivalent to increasing a pixel density of second sub-pixels 8 in the optical component arrangement area 5, thereby effectively reducing a difference between the pixel density of the optical component arrangement area 5 and the pixel density of the first display area 4. In this way, an effect on the overall image display by the optical component arrangement area 5 can be alleviated, and thus the display effect can be improved.

It should be noted that, with further reference to FIG. 2, the first pixel circuit 9 includes an active layer 15, a gate electrode 16, and a source/drain layer 17 that are stacked. The first light-emitting element 10 and the second light-emitting element 11 each include an anode 18, a light-emitting layer 19 and a cathode 20 that are stacked.

In an example, with further reference to FIG. 1, the first sub-pixels 7 in the first display area 4 have a first pixel density, and the second sub-pixels 8 in the optical component arrangement area 5 have a second pixel density. Here, the pixel density is equal to the second pixel density. In this case, the optical component arrangement area 5 and the first display area 4 have the same display quality. The optical component arrangement area 5 does not adversely affect the overall display image, and the display effect of the overall image is optimized. Moreover, it should be noted that since the number of metal wires forming the pixel circuit is much larger than the number of metal wires forming the light-emitting element, increasing the number of second light-emitting elements 11 in the optical component arrangement area 5 without a pixel circuit provided in the optical component arrangement area 5 will not have a significant effect on the light transmittance of the optical component arrangement area 5.

Before explaining the following technical solution, an operation principle of the first pixel circuit 9 will be described by taking the first pixel circuit 9 adopting a "7T1C" circuit structure shown in FIG. 3 as an example and in combination with a signal time sequence diagram shown in FIG. 4.

One driving cycle of the first pixel circuit 9 includes an initialization period t1, a charging period t2, and a light-emitting control period t3.

During the initialization period t1, a first gate scanning signal line Scan1 provides a low level, a second gate scanning signal line Scan2 and a light-emitting control signal line Emit each provide a high level, and a reference voltage line Vref provides a reference voltage signal which resets a gate electrode of a driving transistor T3 via a fifth transistor T5 that is turned on, and resets an anode of the first light-emitting element 10 via a seventh transistor T7 that is turned on.

During the charging period t2, the second gate scanning signal line Scan2 provides a low level, the first gate scanning signal line Scan1 and the light-emitting control signal line Emit each provide a high level, and a data line Data writes a data signal $V_{Data}$ to the driving transistor T3 via a second transistor T2 and a fourth transistor T4 that are turned on.

During the light-emitting control period t3, the light-emitting control signal line Emit provides a low level, the first gate scanning signal line Scan1 and the second gate scanning signal line Scan2 each provide a high level, a first transistor T1 and a sixth transistor T6 are turned on, and the light-emitting element 10 emits light in response to a driving current converted from the data signal $V_{Data}$ and a power supply signal $V_{PVDD}$ provided by a power supply signal line PVDD. Here, the driving current is according to the following equation $$I = \frac{1}{2}\mu_n C_{ox} \frac{W}{L}(V_{PVDD} - V_{Data})^2,$$

where $\mu_n$ represents an electron migration rate, $C_{OX}$ represents a gate oxide capacitance per unit area, and $$\frac{W}{L}$$

represents a cannel width-to-length ratio of the driving transistor T3.

Figure 5:
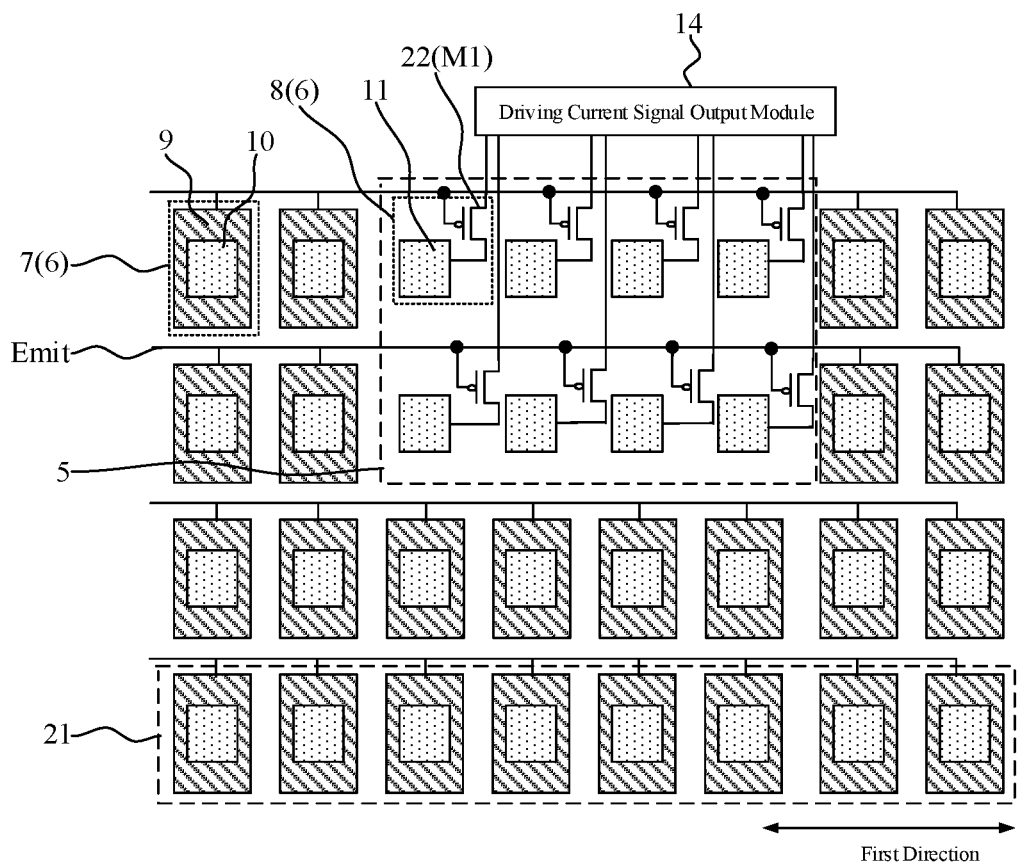
FIG. 5 is a schematic diagram of a structure of a portion of a display device according to an embodiment of the present disclosure.

FIG. 5 is a schematic diagram of a structure of a portion of a display device according to an embodiment of the present disclosure. In an example, as shown in FIG. 5, the display panel 1 further includes: a plurality of rows 21 of sub-pixels, each row 21 of sub-pixels including a plurality of sub-pixels 6 arranged along a first direction; and a plurality of light-emitting control signal lines Emit corresponding to the plurality of rows 21 of sub-pixels in one-to-one correspondence and each are electrically connected to the first pixel circuits 9 of the corresponding row 21 of sub-pixels. The second sub-pixel 8 further includes a first switch unit 22, and the first switch unit 22 is electrically connected to the light-emitting control signal line Emit, the driving current signal output module 14 and the second light-emitting element 11. The first switch unit 22 is configured to transmit the second driving current signal to the second light-emitting element 11 under driving of the light-emitting control signal provided by the light-emitting control signal line Emit. Here, the light-emitting control signal line Emit and the second light-emitting element 11 that are electrically connected to a same first switch unit 22 correspond to a same row 21 of sub-pixels.

The second sub-pixel 8 is provided with the first switch unit 22 and the first switch unit 22 is electrically connected to the light-emitting control signal line Emit, so that the first switch unit 22 can perform control, under driving of the light-emitting control signal provided by the light-emitting control signal line Emit, in such a manner that the second driving current signal is transmitted to the second light-emitting element 11. With reference to the circuit structure of the first pixel circuit 9 shown in FIG. 3, the first switch unit 22 is equivalent to the sixth transistor T6 in the first pixel circuit 9, and both of them have a same function. With such configuration, a light-emitting duration of the second sub-pixel 8 and a light-emitting duration of the first sub-pixel 7 in a same row 21 of sub-pixels are controlled by a same light-emitting control signal, thereby improving an accuracy of controlling the light-emitting duration of the second sub-pixel 8. Besides, there is no need to provide an additional driving signal for controlling the light-emitting duration of the second sub-pixel 8, thereby reducing a design complexity.

Further, with further reference to FIG. 5, the first switch unit 22 includes a first switch transistor M1, which includes a gate electrode electrically connected to the light-emitting control signal line Emit, a first electrode electrically connected to the driving current signal output module 14, and a second electrode electrically connected to the second light-emitting element 11. When the light-emitting control signal line Emit provides a turned-on level, the first switch transistor M1 is turned on, and the driving current signal output module 14 outputs a second driving current signal, which is in turn transmitted to the second light-emitting element 11 via the first switch transistor M1 that is turned on, so as to drive the second light-emitting element 11 to emit light.

It should be noted that since the first switch transistor M1 and the sixth transistor T6 in the first pixel circuit 9 are driven by the light-emitting control signal provided by the light-emitting control signal line Emit, the first switch transistor M1 and the sixth transistor T6 belong to a same type. That is, both the first switch transistor M1 and the sixth transistor T6 can be P-type transistors or N-type transistors.

Figure 6:
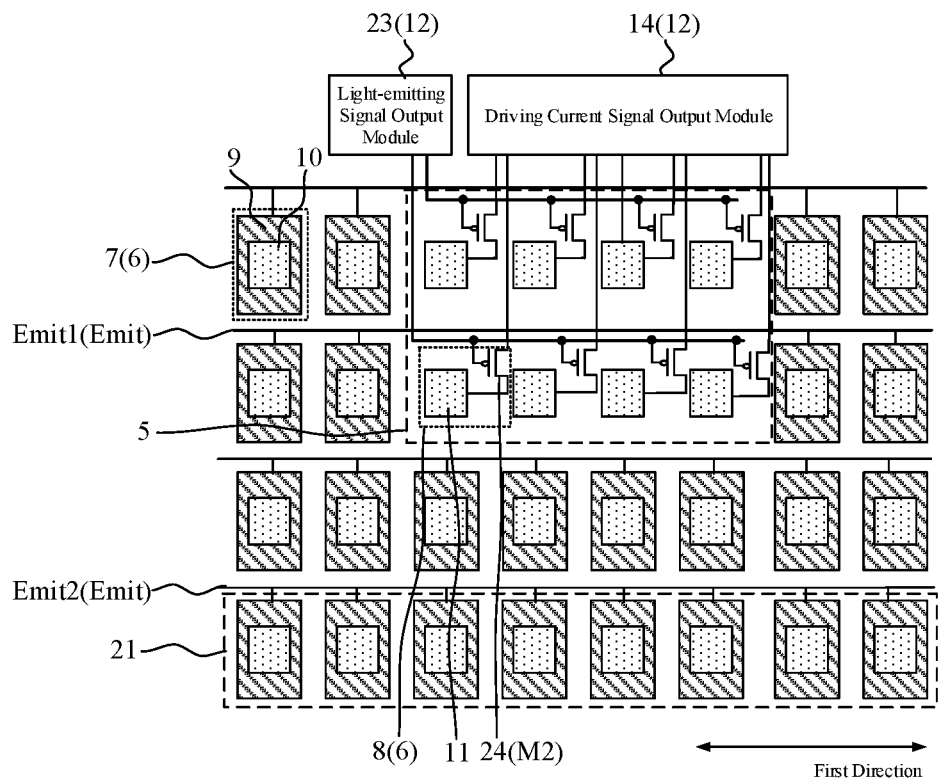
FIG. 6 is a schematic diagram of another structure of a portion of a display device according to an embodiment of the present disclosure.

FIG. 6 is a schematic diagram of another structure of a portion of a display device according to an embodiment of the present disclosure. In an example, as shown in FIG. 6, the driving chip 12 further includes a light-emitting signal output module 23, which is configured to output a first light-emitting control signal, and the second sub-pixel 8 further includes a second switch unit 24, which is connected to the light-emitting signal output module 23, the driving current signal output module 14, and the second light-emitting element 11. The second switch unit 24 is configured to transmit the second driving current signal to the second light-emitting element 11 under driving of the first light-emitting control signal output by the light-emitting signal output module 23.

The light-emitting duration of the second sub-pixel 8 is controlled by the light-emitting signal output module 23, so that light emission of the first sub-pixel 7 and the second sub-pixel 8 can be controlled separately, thereby making a control manner thereof more flexible. For example, when the display device is in an imaging mode, in order to prevent light emitted by the second sub-pixel 8 from interfering with ambient light captured by the camera, the light-emitting signal output module 23 can continuously output a non-turned-on level to control the second sub-pixel 8 not to emit light. In this case, the first sub-pixel 7 in the first display area 4 can still emit light normally under driving of the light-emitting control signal provided by the light-emitting control signal line Emit. Alternatively, if the second sub-pixel 8 in the optical component arrangement area 5 is needed to emit light, the light-emitting signal output module 23 can output a first light-emitting control signal having the same time sequence as that of the light-emitting control signal provided by the light-emitting control signal line Emit, so as to drive the second sub-pixel 8 to emit light, thereby achieving normal image display.

Further, with further reference to FIG. 6, the second switch unit 24 includes a second switch transistor M2. The second switch transistor M2 includes a gate electrode electrically connected to the light-emitting signal output module 23, a first electrode electrically connected to the driving current signal output module 14, and a second electrode electrically connected to the second light-emitting element 11. When the light-emitting signal output module 23 provides a turned-on level, the second switch transistor M2 is turned on, and a second driving current signal output by the driving current signal output module 14 is transmitted to the second light-emitting element 11 via the turned-on second switch transistor M2, so as to drive the second light-emitting element 11 to emit light.

It should be noted that since the second switch transistor M2 is turned on is separately controlled by the first light-emitting control signal output by the light-emitting signal output module 23, the second switch transistor M2 and the sixth transistor T6 in the first pixel circuit 9 can be of a same type or different types.

Further, with further reference to FIG. 6, the display panel 1 further includes a plurality of light-emitting control signal lines Emit electrically connected to the first pixel circuits 9.

The light-emitting control signal lines Emit include a first light-emitting control line Emit1 and a second light-emitting control line Emit2. The first light-emitting control line Emit1 passes through the optical component arrangement area 5, and the first light-emitting control line Emit1 is electrically insulated from the second sub-pixel 8. An extending direction of the first light-emitting control line Emit1 is the same as an extending direction of the second light-emitting control line Emit2. With such configuration, the first light-emitting control line Emit1 and the second light-emitting control line Emit2 have same wiring lengths, thereby reducing a wiring resistance difference there between and thus reducing an attenuation difference of the light-emitting control signals transmitted on the first light-emitting control line Emit1 and the second light-emitting control line Emit2. In this way, it can be guaranteed that these two parts of light-emitting control signals have a same driving capability for the first sub-pixel 7, thereby increasing light-emitting stability of the first sub-pixel 7.

Figure 7:
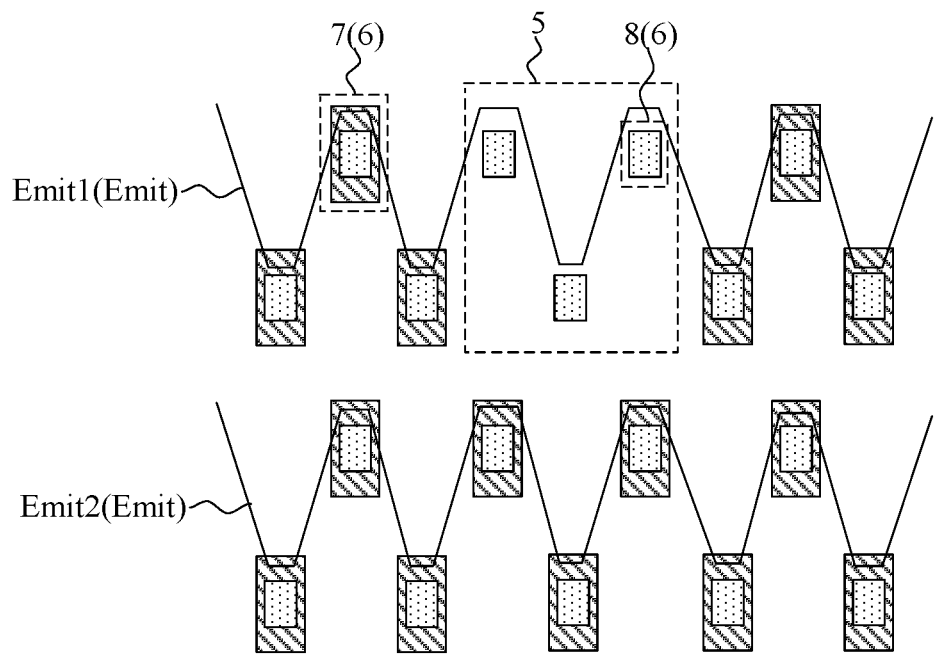
FIG. 7 is a schematic diagram showing extension of light-emitting control signal lines according to an embodiment of the present disclosure.

It should be noted that different arrangements of the sub-pixels 6 will result in different extending directions of the light-emitting control signal line Emit. For example, with further reference to FIG. 6, if the sub-pixels 6 are arranged in a matrix, both the first light-emitting control line Emit1 and the second light-emitting control line Emit2 will extend along the first direction. Alternatively, as shown in FIG. 7, which is a schematic diagram showing an extension of light-emitting control signal lines according to an embodiment of the present disclosure, if the sub-pixels 6 are misaligned, both the first light-emitting control line Emit1 and the second light-emitting control line Emit2 will extend in a bent manner. The extending directions of the first light-emitting control line Emit1 and the second light-emitting control line Emit2 will be set based on an actual arrangement of the sub-pixels 6, which will not be limited by the embodiments of the present disclosure.

Figure 8:
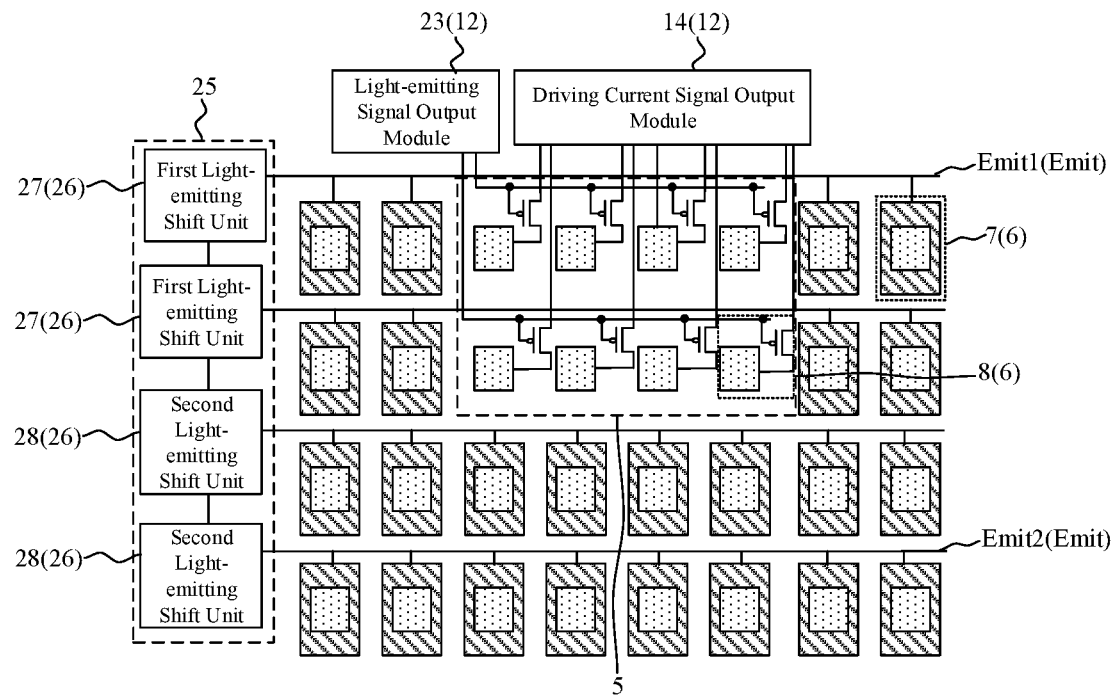
FIG. 8 is a schematic diagram of still another structure of a portion of a display device according to an embodiment of the present disclosure.

FIG. 8 is a schematic diagram of still another structure of a portion of a display device according to an embodiment of the present disclosure. Further, as shown in FIG. 8, the display panel 1 further includes a light-emitting shift register 25. The light-emitting shift register 25 includes a plurality of light-emitting shift register units 26 that is cascaded. The light-emitting shift register units 26 include a first light-emitting shift unit 27 and a second light-emitting shift unit 28. The first light-emitting shift unit 27 is electrically connected to the first light-emitting control line Emit1 and is configured to output the second light-emitting control signal to the first light-emitting control line Emit1. The second light-emitting shift unit 28 is electrically connected to the second light-emitting control line Emit2 and is configured to output the third light-emitting control signal to the second light-emitting control line Emit2. Here, a signal intensity of the second light-emitting control signal is smaller than that of the third light-emitting control signal.

Since the first light-emitting control line Emit1 is electrically insulated from second sub-pixel 8, a number of sub-pixels 6 driven by the first light-emitting control line Emit1 is smaller than a number of sub-pixels 6 driven by the second light-emitting control line Emit2. As a result, the first light-emitting control line Emit1 has a smaller load, and thus a degree of attenuation of the second light-emitting control signal transmitted on the first light-emitting control line Emit1 is smaller. In this embodiment of the present disclosure, by reducing the signal intensity of the second light-emitting control signal output by the first light-emitting shift unit 27, the signal intensity of the second light-emitting control signal with a smaller attenuation tends to be the same as the signal intensity of the third light-emitting control signal with a larger attenuation. That is, the second light-emitting control signal and the third light-emitting control signal actually received by different first sub-pixels 7 tend to have a same signal intensity. In this regard, the second light-emitting control signal and the third light-emitting control signal have a same driving capability for the first sub-pixel 7, thereby improving the light-emitting stability of the first sub-pixel 7.

In addition, it should be noted that an excessively large difference between a load of the first light-emitting control line Emit1 and a load of the second light-emitting control line Emit2 would significantly affect light-emitting brightness of the first sub-pixels 7 electrically connected to the first light-emitting control lines Emit1. Then, a duty ratio of the second light-emitting control signals output by the first light-emitting shift unit 27 can also be adjusted to achieve adjustment of the light-emitting durations of these first sub-pixels 7, so that light-emitting brightness of these first sub-pixels 7 and light-emitting brightness of the first sub-pixels 7 that are electrically connected to the second light-emitting control line Emit2 can be uniform.

Figure 9:
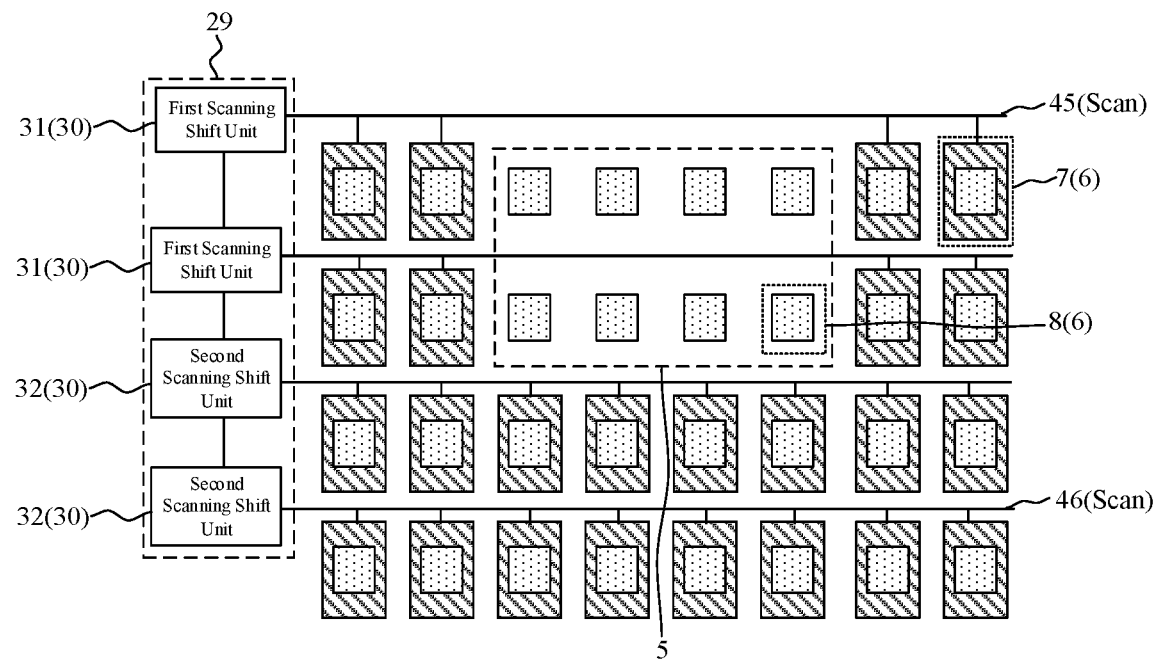
FIG. 9 is a schematic diagram showing an extension of gate scanning signal lines according to an embodiment of the present disclosure.

FIG. 9 is a schematic diagram showing an extension of gate scanning signal lines according to an embodiment of the present disclosure. In an example, as shown in FIG. 9, the display panel 1 further includes a plurality of gate scanning signal lines Scan electrically connected to the first pixel circuits 9. The gate scanning signal lines Scan include a first gate scanning line 45 and a second gate scanning line 46. The first gate scanning line 45 passes through the optical component arrangement area 5, and the first gate scanning line 45 is electrically insulated from the second sub-pixels 8. An extending direction of the first gate scanning line 45 is the same as an extending direction of the second gate scanning line 46.

With such configuration, the first gate scanning line 45 and second gate scanning line 46 have same wiring lengths, thereby reducing a wiring resistance difference therebetween, and thus reducing an attenuation difference of the gate scanning signals transmitted on the first gate scanning line 45 and the second gate scanning line 46. In this way, it can be guaranteed that these two parts of gate scanning signals have a same driving capability for the sub-pixel 6, thereby increasing light-emitting stability of the first sub-pixel 7.

Figure 3:
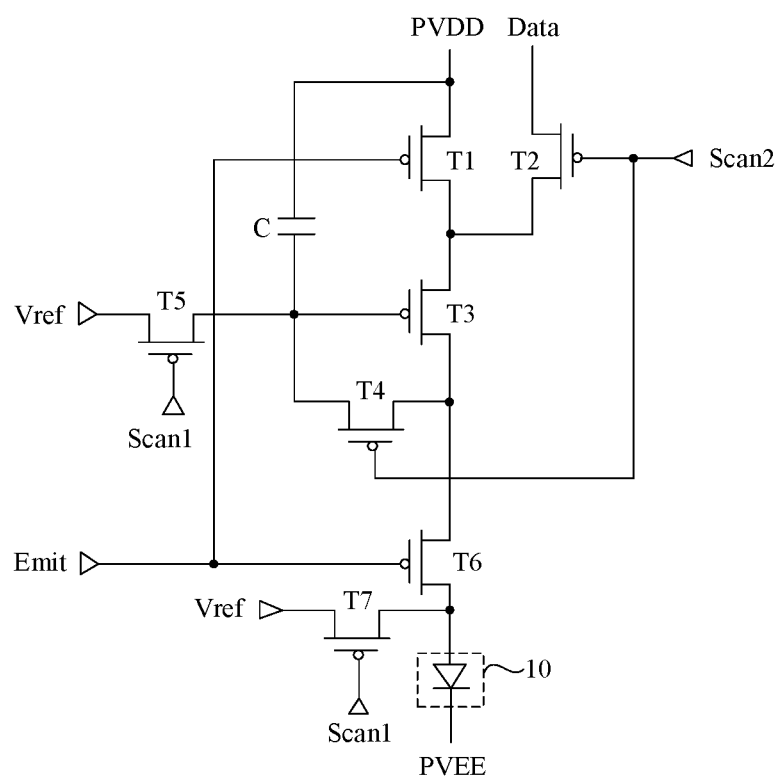
FIG. 3 is a schematic diagram of a structure of a pixel circuit in the related art.
Figure 4:
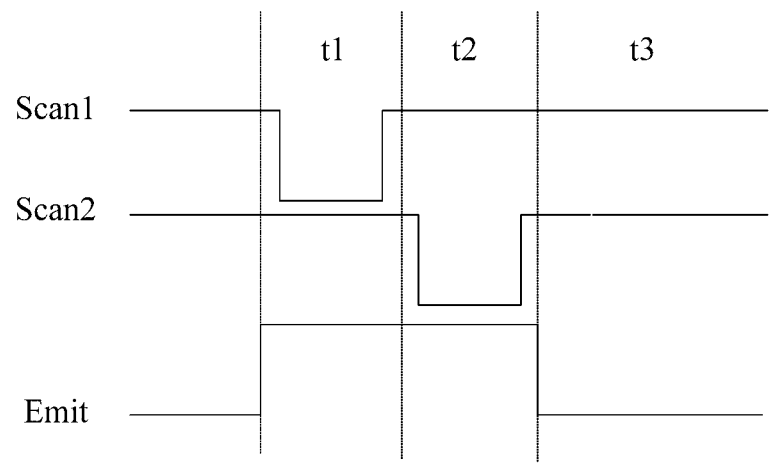
FIG. 4 is a time sequence diagram corresponding to FIG. 3.

It should be noted that, in combination with FIG. 3, when the first pixel circuit 9 is electrically connected to the first gate scanning signal line Scan1 and the second gate scanning signal line Scan2, the above-mentioned gate scanning signal line Scan is a generic term for the first gate scanning signal line Scan1 and the second gate scanning signal line Scan2. That is, the display panel includes two types of gate scanning signal lines Scan, which are the first gate scanning signal line Scan1 and the second gate scanning signal line Scan2. Moreover, the first gate scanning signal line Scan1 includes a first gate scanning line 45 and a second gate scanning line 46, and the second gate scanning signal line Scan2 also includes a first gate scanning line 45 and a second gate scanning line 46.

Figure 10:
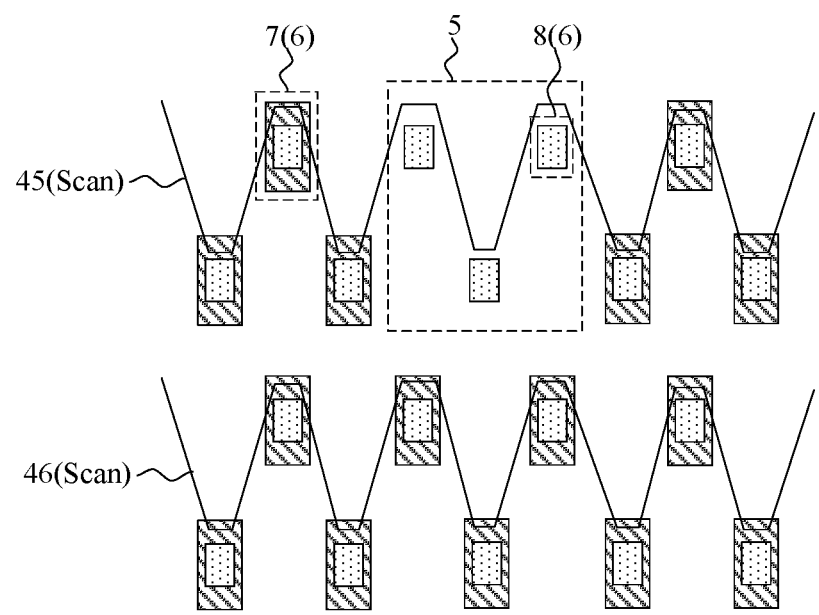
FIG. 10 is a schematic diagram showing another extension of gate scanning signal lines according to an embodiment of the present disclosure.

In addition, it should be noted that different arrangements of the sub-pixels 6 will result in different extending directions of the gate scanning signal line Scan. For example, with further reference to FIG. 9, if the sub-pixels 6 are arranged in a matrix, both the first gate scanning line 45 and the second gate scanning line 46 will extend along the first direction. Alternatively, as shown in FIG. 10, which is a schematic diagram showing another extension of gate scanning signal lines according to an embodiment of the present disclosure, if the sub-pixels 6 are arranged in a misalignment manner, both the first gate scanning line 45 and the second gate scanning line 46 will extend in a bending manner. The extending directions of the first gate scanning line 45 and the second gate scanning line 46 will be set based on an actual arrangement of the sub-pixels 6, which will not be limited by this embodiment of the present disclosure.

With further reference to FIG. 9, the display panel 1 further includes a scanning shift register 29. The scanning shift register 29 includes a plurality of scanning shift register units 30 that is cascaded. The scanning shift register units 30 include a first scanning shift unit 31 and a second scanning shift unit 32. The first scanning shift register unit 30 is electrically connected to the first gate scanning line 45 and configured to output a first gate scanning signal to the first gate scanning line 45. The second scanning shift unit 32 is electrically connected to the second gate scanning line 46 and configured to output a second gate scanning signal to the second gate scanning line 46. Here, a signal intensity of the first gate scanning signal is smaller than a signal intensity of the second gate scanning signal.

Since the first gate scanning line 45 is electrically insulated from the second sub-pixels 8, a number of sub-pixels 6 driven by the first gate scanning line 45 is smaller than a number of sub-pixels 6 driven by the second gate scanning line 46. As a result, the first gate scanning line 45 has a smaller load, and thus a degree of attenuation of a gate scanning signal on the first gate scanning line 45 is smaller. In this embodiment of the present disclosure, by reducing the signal intensity of the first gate scanning signal output by the first scanning shift register unit 30, it can be achieved that the signal intensity of the first gate scanning signal with a smaller attenuation tends to be the same as the signal intensity of the second gate scanning signal with a larger attenuation. That is, the first gate scanning signal and the second gate scanning signal actually received by different first sub-pixels 7 tend to have a same signal intensity, thereby achieving that the first gate scanning signal and the second gate scanning signal have a same driving capability for the first sub-pixel 7, thereby improving the light-emitting stability of the first sub-pixel 7.

Figure 11:
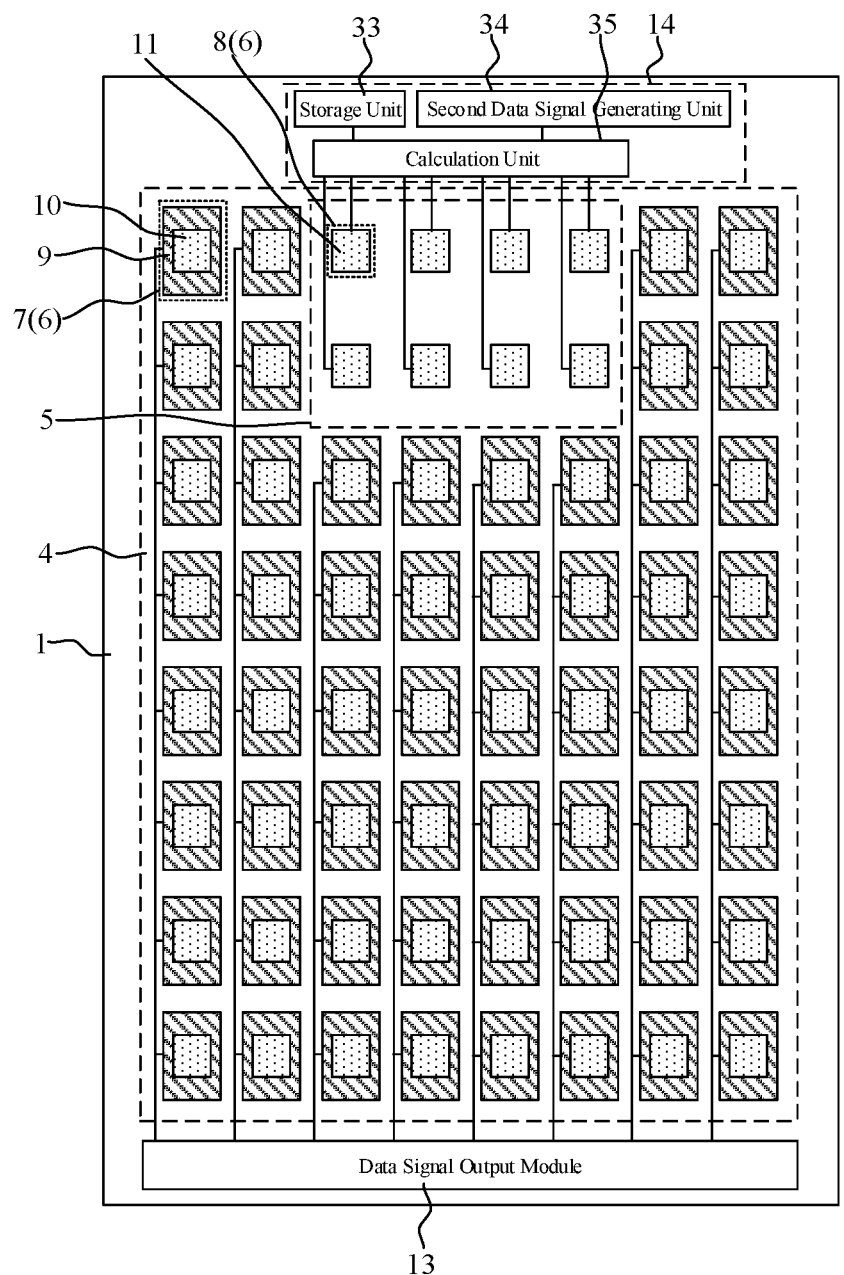
FIG. 11 is a schematic diagram of a structure of a driving current signal output module according to an embodiment of the present disclosure.

FIG. 11 is a schematic diagram of a structure of a driving current signal output module according to an embodiment of the present disclosure. In an example, as shown in FIG. 11, the driving current signal output module 14 includes a storage unit 33, a second data signal generating unit 34, and a calculation unit 35. The storage unit 33 is configured to pre-store a threshold voltage of the driving transistor in the first pixel circuit 9. The second data signal generating unit 34 is configured to generate a corresponding second data signal based on an image displayed in the optical component arrangement area 5. The calculation unit 35 is electrically connected to the storage unit 33, the second data signal generating unit 34, and the second light-emitting element 11. The calculation unit 35 is configured to calculate and output the second driving current signal based on the threshold voltage and the second data signal.

It should be noted that the first pixel circuit 9 can internally compensate the threshold voltage of the driving transistor by means of its own structure, so that a first driving current finally output by the first pixel circuit 9 is independent of the threshold voltage, thereby preventing the threshold voltage from affecting the light-emitting brightness of the first light-emitting element 10. In view of this, in this embodiment of the present disclosure, the threshold voltage of the driving transistor in the first pixel circuit 9 is stored in the storage unit 33, so that the calculation unit 35 calculates the second driving current signal based on the threshold voltage, which is equivalent to using the driving current signal output module 14 to externally compensate the threshold voltage. In this way, the driving current signal output module 14 can better simulate the first pixel circuit 9, thereby improving consistency of the light-emitting brightness of the second sub-pixel 8 and the first sub-pixel 7.

Figure 12:
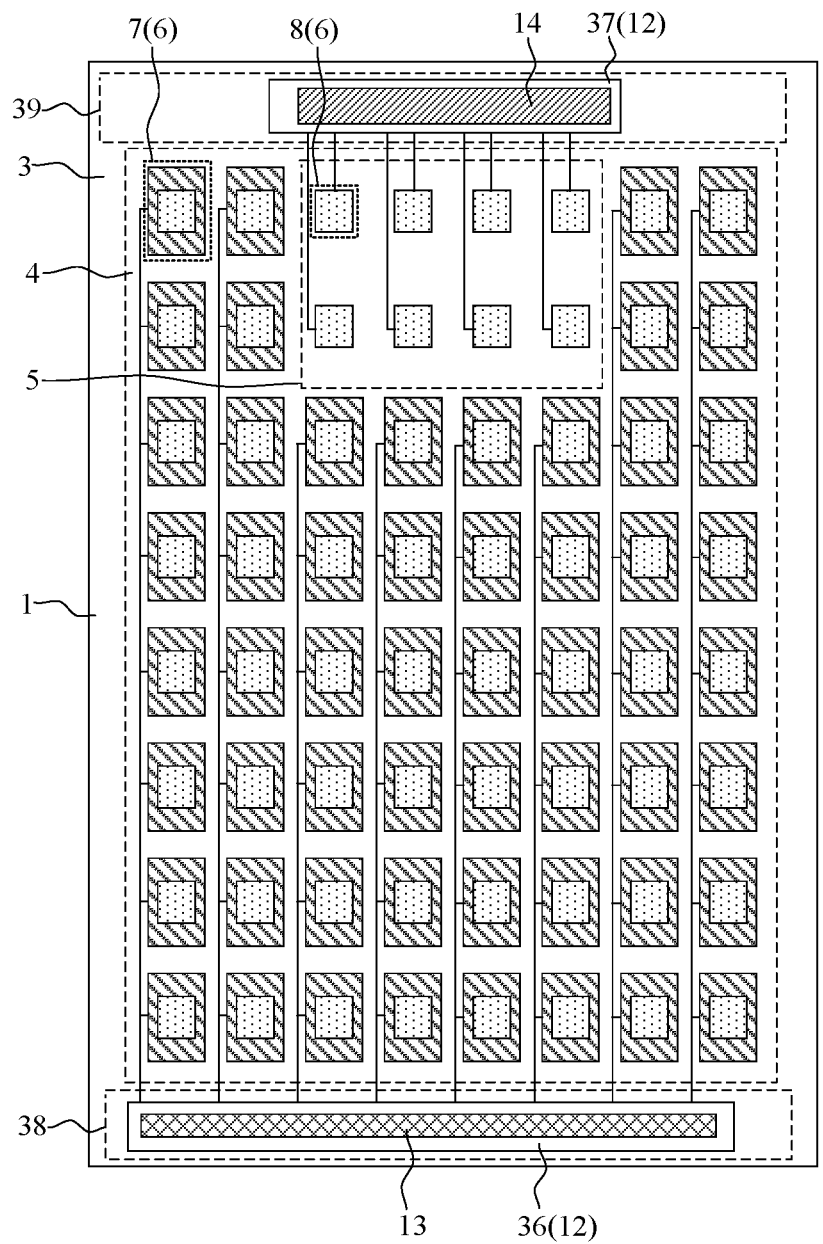
FIG. 12 is a schematic diagram of a structure of a driving chip according to an embodiment of the present disclosure.

FIG. 12 is a schematic diagram of a structure of a driving chip according to an embodiment of the present disclosure. In an example, as shown in FIG. 12, two driving chips 12 are provided, which are a first driving chip 36 and a second driving chip 37. The data signal output module 13 is integrated into the first driving chip 36, and the driving current signal output module 14 is integrated into the second driving chip 37. By integrating the data signal output module 13 and the driving current signal output module 14 respectively in the first driving chip 36 and in the second driving chip 37, the first driving chip 36 and the second driving chip 37 only need to implement respective functions, thereby reducing the design complexity of the first driving chip 36 and the second driving chip 37.

Further, with further reference to FIG. 12, the non-display area 3 includes a first non-display area 38 and a second non-display area 39 opposite to the first non-display area 38. The first driving chip 36 is bound to the first non-display area 38, and the second driving chip 37 is bound to the second non-display area 39. The optical component arrangement area 5 is located at a side of the display area 2 close to the second non-display area 39. With such configuration, the optical component arrangement area 5 is closer to the second driving chip 37, and a connection wire between the second driving chip 37 and the second light-emitting element 11 is correspondingly shorter. This not only reduces a voltage drop of the second driving current signal on the connection wire and improves transmission stability of the second driving current signal, but also reduces space occupied by the connection wire in the display panel 1.

Figure 13:
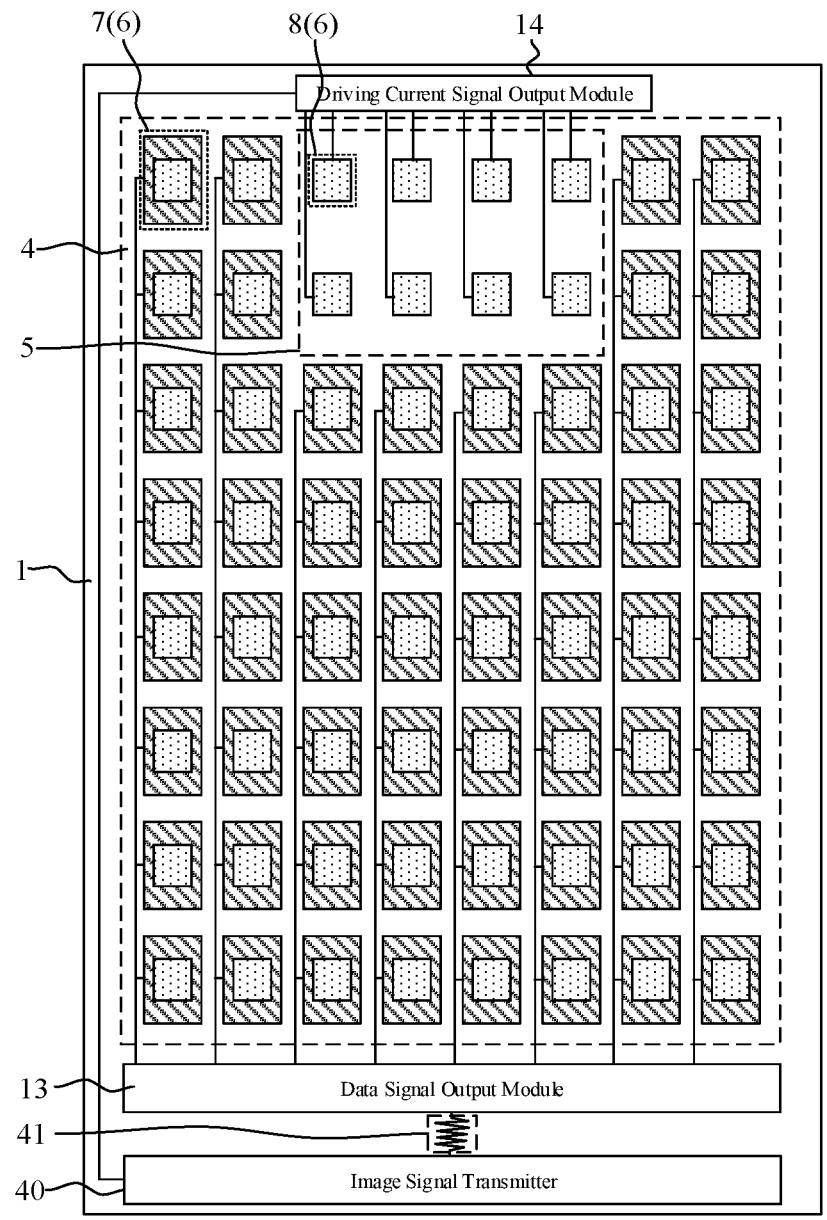
FIG. 13 is a schematic diagram of another structure of a display device according to an embodiment of the present disclosure.

FIG. 13 is a schematic diagram of another structure of a display device according to an embodiment of the present disclosure. In an example, as shown in FIG. 13, the display device further includes an image signal transmitter 40. The image signal transmitter 40 is electrically connected to the data signal output module 13 and the driving current signal output module 14. The image signal transmitter 40 is configured to generate a first grayscale signal based on the image displayed in the first display area 4 and output the first grayscale signal to the data signal output module 13, and generate a second grayscale signal based on the image displayed in the optical component arrangement area 5 and output the second grayscale signal to the driving current signal output module 14. A delay wire 42 is connected between the image signal transmitter 40 and the data signal output module 13. The delay wire 42 is used to extend time spent in transmitting the first grayscale signal to the data signal output module 13.

After the image signal transmitter 40 provides the first grayscale signal to the data signal output module 13, the data signal output module 13 converts the first grayscale signal to the first data signal based on a pre-stored grayscale-data voltage mapping relationship. After the image signal transmitter 40 provides the second grayscale signal to the driving current signal output module 14, the driving current signal output module 14 converts the second grayscale signal into the second data signal based on a pre-stored grayscale-data voltage mapping relationship.

Compared with a case in which the first data signal is converted into the first driving current by directly using the first pixel circuit 9, it takes certain time for the driving current signal output module 14 to calculate and generate the second driving current signal based on the second data signal. By providing the delay wire 42 between the image signal transmitter 40 and the data signal output module 13, time spent in transmitting the first grayscale signal to the data signal output module 13 can be delayed, so as to reserve certain calculation time for the driving current signal output module 14. In this way, it allows the first pixel circuit 9 and the driving current signal output module 14 to output a driving current signal at the same time, thereby improving light-emitting reliability of the first sub-pixel 7 and the second sub-pixel 8.

Further, with further reference to FIG. 13, in order to effectively extend the time spent in transmitting the first grayscale signal to the data signal output module 13, the delay wire 42 may be a bent wire.

Figure 14:
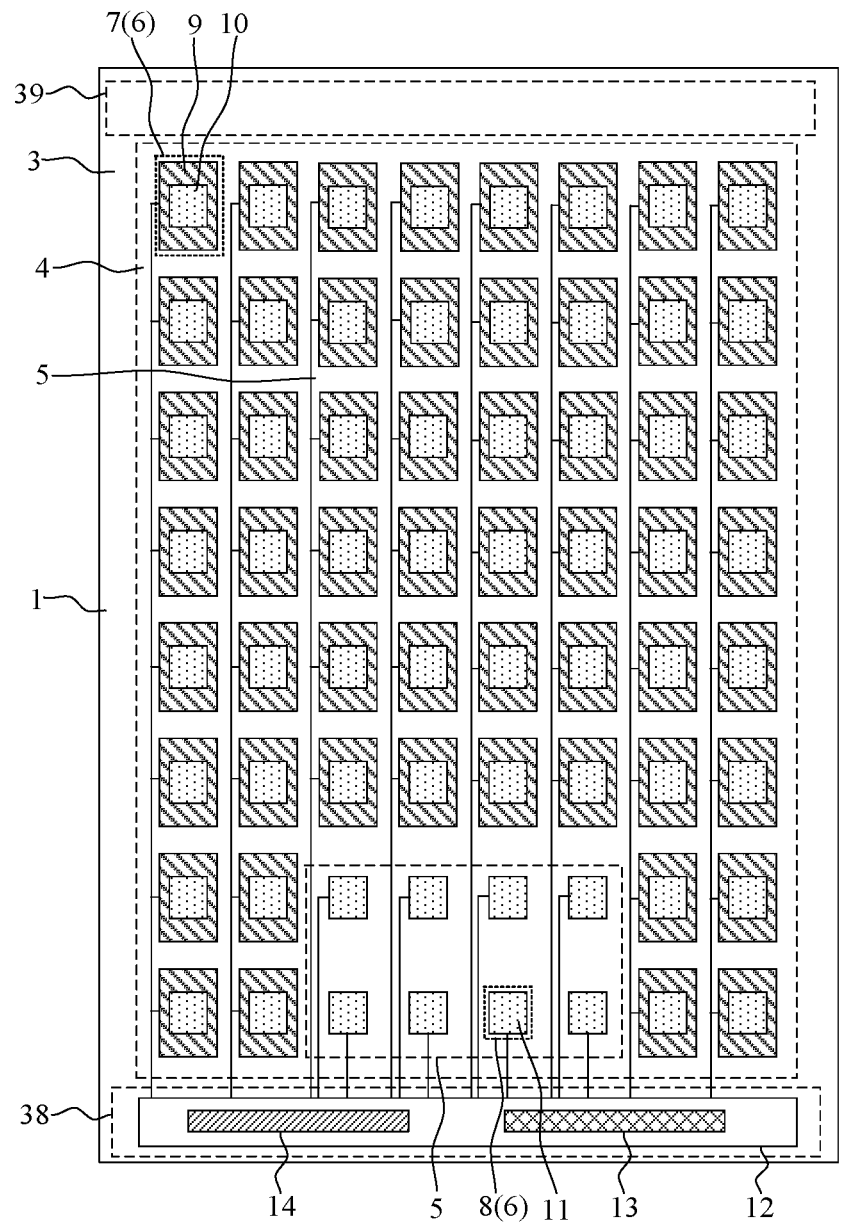
FIG. 14 is a schematic diagram of another structure of a driving chip according to an embodiment of the present disclosure.

FIG. 14 is a schematic diagram of another structure of a driving chip according to an embodiment of the present disclosure. In an example, as shown in FIG. 14, the data signal output module 13 and the driving current signal output module 14 are integrated into a same driving chip 12. In this case, the display device only needs one driving chip 12, thereby reducing a manufacturing cost and reducing a bezel width occupied by the driving chip 12.

Further, with further reference to FIG. 14, the non-display area 3 includes a first non-display area 38 and a second non-display area 39 opposite to the first non-display area 38. The driving chip 12 is bound to the first non-display area 38. The optical component arrangement area 5 is located at a side of the display area 2 close to the first non-display area 38. With such configuration, the optical component arrangement area 5 is closer to the driving chip 12, and a connection wire between the driving chip 12 and the second light-emitting element 11 is correspondingly shorter. This not only reduces a voltage drop of the second driving current signal on the connection wire and improves transmission stability of the second driving current signal, but also reduces space occupied by the connection wire in the display panel 1.

Figure 15:
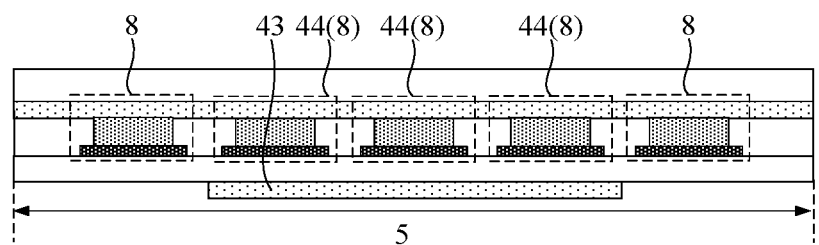
FIG. 15 is a schematic diagram showing an arrangement position of a camera according to an embodiment of the present disclosure.

FIG. 15 is a schematic diagram showing an arrangement position of a camera according to an embodiment of the present disclosure. In an example, as shown in FIG. 15, the display device further includes a camera 43, which is located in the optical component arrangement area 5. The second sub-pixels 8 include at least one second sub-pixel 44 overlapping with the camera 43 in a direction perpendicular to a plane of the display panel 1. The driving current signal output module 14 is further configured to control the at least one second sub-pixel 44 not to emit light when the camera 43 is capturing an image. When the camera 43 is capturing an image, controlling the second sub-pixel 44 not to emit light can prevent light emitted by the second sub-pixel 44 from interfering with external ambient light captured by the camera 43, thereby optimizing an imaging accuracy.

Figure 16:
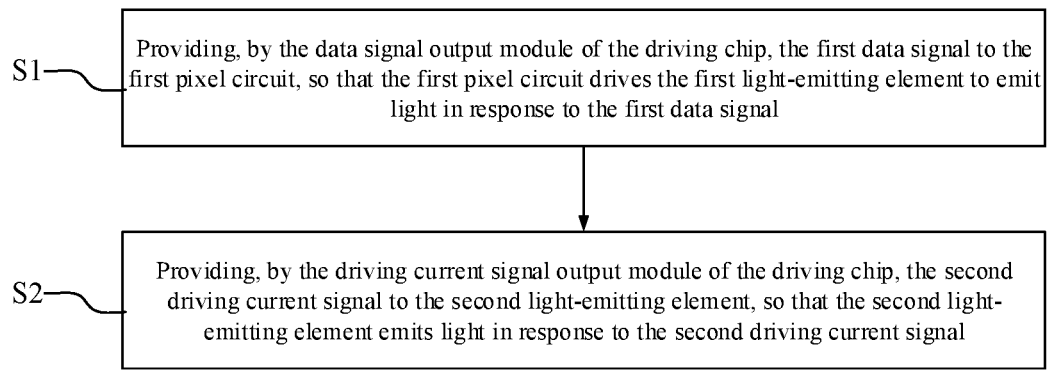
FIG. 16 is a flowchart of a driving method according to an embodiment of the present disclosure.

An embodiment of the present disclosure further provides a method for driving the display device described above. FIG. 16 is a flowchart of a driving method according to an embodiment of the present disclosure. As shown in FIG. 16, the method for driving the display device includes following steps.

At step S1, the data signal output module 13 of the driving chip 12 provides the first data signal to the first pixel circuit 9, so that the first pixel circuit 9 drives, in response to the first data signal, the first light-emitting element 10 to emit light.

At step S2, the driving current signal output module 14 of the driving chip 12 provides the second driving current signal to the second light-emitting element 11, so that the second light-emitting element 11 emits light in response to the second driving current signal.

With the method for driving the display device in this embodiment of the present disclosure, the driving current signal output module 14 can be used to simulate the pixel circuit for directly outputting the second driving current signal to the second light-emitting element 11, so that the second sub-pixel 8 in the optical component arrangement area 5 does not need to be provided with a pixel circuit, but only the second light-emitting element 11 which is electrically connected to the driving current signal output module 14 is needed. In this way, the number of metal wires arranged in the optical component arrangement area 5 can be greatly reduced, thereby effectively increasing the light transmittance of the optical component arrangement area 5. Moreover, with a goal of achieving high light transmittance of the optical component arrangement area 5, a pixel density of second sub-pixels 8 in the optical component arrangement area 5 can be increased, thereby alleviating an effect on the overall image display by the optical component arrangement area 5.

In an example, in combination with FIG. 5, the display panel 1 further includes: a plurality of rows 21 of sub-pixels, each row 21 of sub-pixels including a plurality of sub-pixels 6 arranged along the first direction; and a plurality of light-emitting control signal lines Emit corresponding to the plurality of rows 21 of sub-pixels in one-to-one correspondence and each are electrically connected to the first pixel circuits 9 of the corresponding row 21 of sub-pixels. The second sub-pixel 8 further includes a first switch unit 22, and the first switch unit 22 is electrically connected to the light-emitting control signal line Emit, the driving current signal output module 14 and the second light-emitting element 11. Here, the light-emitting control signal line Emit and the second light-emitting element 11 that are electrically connected to a same first switch unit 22 correspond to a same row 21 of sub-pixels. Based on this, a process in which the driving current signal output module 14 provides the second driving current signal to the second light-emitting element 11 may include: transmitting, by the first switch unit 22 and under driving of the light-emitting control signal provided by the light-emitting control signal line Emit, the second driving current signal output by the driving current signal output module 14 to the second light-emitting element 11.

With this configuration, a light-emitting duration of the second sub-pixel 8 and a light-emitting duration of the first sub-pixel 7 in a same row 21 of sub-pixels are controlled by a same light-emitting control signal, thereby improving an accuracy of controlling the light-emitting duration of the second sub-pixel 8. Moreover, there is no need to provide an additional driving signal for controlling the light-emitting duration of the second sub-pixel 8, thereby reducing design complexity.

In an example, in combination with FIG. 6, the driving chip 12 further includes a light-emitting signal output module 23, and the second sub-pixel 8 further includes a second switch unit 24, which is connected to the light-emitting signal output module 23, the driving current signal output module 14, and the second light-emitting element 11. Based on this, the process in which the driving current signal output module 14 provides the second driving current signal to the second light-emitting element 11 may include: transmitting, by the second switch unit 24 and under driving of the first light-emitting control signal output by the light-emitting signal output module 23, the second driving current signal output by the driving current signal output module 14 to the second light-emitting element 11.

With such a configuration, the light-emitting duration of the second sub-pixel 8 can be separately controlled by the light-emitting signal output module 2. When the display device is in an imaging mode, the light-emitting signal output module 23 can continuously output a non-turned-on level to control the second sub-pixel 8 not to emit light. The light-emitting signal output module 23 can also output a first light-emitting control signal that corresponds to the same time sequence as that of the second light-emitting control signal, so as to drive the second sub-pixel 8 to emit light, thereby making a control manner thereof more flexible.

In an example, in combination with FIG. 11, the process in which the driving current signal output module 14 generates the second driving current signal may include: pre-storing a threshold voltage of the driving transistor in the first pixel circuit 9; generating a corresponding second data signal based on an image displayed in the optical component arrangement area 5; and calculating and outputting the second driving current signal based on the threshold voltage and the second data signal. The calculation unit 35 calculating the second driving current signal based on the threshold voltage is equivalent to externally compensating the threshold voltage by the driving current signal output module 14, so that the driving current signal output module 14 can better simulate the first pixel circuit 9, thereby improving consistency of the light-emitting brightness of the second sub-pixel 8 and the first sub-pixel 7.

In an example, in combination with FIG. 15, the display device further includes a camera 43, which is located in the optical component arrangement area 5. The second sub-pixels 8 include at least one second sub-pixel 44 overlapping with the camera 43 in a direction perpendicular to the plane of the display panel 1. The method for driving the display device includes: controlling, by the driving current signal output module 14, the second sub-pixel 44 not to emit light when the camera 43 is capturing an image. When the camera 43 is capturing an image, controlling the second sub-pixel 44 not to emit light can prevent light emitted by the second sub-pixel 44 from interfering with external ambient light captured by the camera 43, thereby optimizing an imaging accuracy.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

Finally, it should be noted that, the above-described embodiments are merely for illustrating the present disclosure but not intended to provide any limitation. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:
1. A display device, comprising:
a display panel having a display area and a non-display area surrounding the display area, the display area comprising a first display area and an optical component arrangement area, and
at least one driving chip,
wherein the display panel comprises:
a plurality of sub-pixels comprising first sub-pixels located in the first display area and second sub-pixels located in the optical component arrangement area, each of the first sub-pixels comprising a first pixel circuit and a first light-emitting element that are electrically connected to each other, and each of the second sub-pixels comprising a second light-emitting element,
wherein the at least one driving chip comprises:
a data signal output module electrically connected to the first pixel circuit and configured to output a first data signal to the first pixel circuit, so that the first pixel circuit outputs, in response to the first data signal, a first driving current signal for driving the first light-emitting element to emit light; and
a driving current signal output module electrically connected to the second light-emitting element and configured to output a second driving current signal to the second light-emitting element, so that the second light-emitting element emits light in response to the second driving current signal.

2. The display device according to claim 1, wherein the first sub-pixels located in the first display area have a first pixel density, the second sub-pixels located in the optical component arrangement area have a second pixel density, and the first pixel density and the second pixel density are identical.

3. The display device according to claim 1, wherein sub-pixels of the plurality of sub-pixels are arranged in a plurality of rows of sub-pixels, and each row of the plurality of rows of sub-pixels comprises sub-pixels arranged along a first direction,
wherein the display panel further comprises a plurality of light-emitting control signal lines corresponding to the plurality of rows of sub-pixels in one-to-one correspondence, and each of the light-emitting control signal lines of the plurality of light-emitting control signal lines is electrically connected to the first pixel circuits of sub-pixels in a corresponding row of sub-pixels,
wherein each of the second sub-pixels further comprises a first switch unit, and the first switch unit is electrically connected to the driving current signal output module, the second light-emitting element, and one of the light-emitting control signal lines the plurality of light-emitting control signal lines is configured to transmit the second driving current signal to the second light-emitting element under driving of a light-emitting control signal provided by the light-emitting control signal lines of the plurality of light-emitting control signal lines, and
wherein one of the light-emitting control signal lines of the plurality of light-emitting control signal lines and the second light-emitting element that are electrically connected to a same first switch unit correspond to a same row of sub-pixels of the plurality of rows of sub-pixels.

4. The display device according to claim 3, wherein the first switch unit comprises a first switch transistor, and the first switch transistor comprises a gate electrode electrically connected to one of the plurality of light-emitting control signal lines, a first electrode electrically connected to the driving current signal output module, and a second electrode electrically connected to the second light-emitting element.

5. The display device according to claim 1, wherein the at least one driving chip further comprises a light-emitting signal output module configured to output a first light-emitting control signal, and
wherein each of the second sub-pixels further comprises a second switch unit, and the second switch unit is electrically connected to the light-emitting signal output module, the driving current signal output module, and the second light-emitting element, and is configured to transmit the second driving current signal to the second light-emitting element under driving of the first light-emitting control signal output by the light-emitting signal output module.

6. The display device according to claim 5, wherein the second switch unit comprises a second switch transistor, and the second switch transistor comprises a gate electrode electrically connected to the light-emitting signal output module, a first electrode electrically connected to the driving current signal output module, and a second electrode electrically connected to the second light-emitting element.

7. The display device according to claim 5, wherein the display panel further comprises a plurality of light-emitting control signal lines electrically connected to the first pixel circuits of the first sub-pixels, the plurality of light-emitting control signal lines comprises a first light-emitting control line and a second light-emitting control line, the first light-emitting control line passes through the optical component arrangement area and is electrically insulated from the second sub-pixels, and an extending direction of the first light-emitting control line and an extending direction of the second light-emitting control line are identical.

8. The display device according to claim 7, wherein the display panel further comprises a light-emitting shift register, the light-emitting shift register comprises a plurality of light-emitting shift register units that is cascaded, and the plurality of light-emitting shift register units comprises a first light-emitting shift unit and a second light-emitting shift unit;
the first light-emitting shift unit is electrically connected to the first light-emitting control line and is configured to output a second light-emitting control signal to the first light-emitting control line;
the second light-emitting shift unit is electrically connected to the second light-emitting control line and is configured to output a third light-emitting control signal to the second light-emitting control line; and
a signal intensity of the second light-emitting control signal is smaller than a signal intensity of the third light-emitting control signal.

9. The display device according to claim 1, wherein the display panel further comprises a plurality of gate scanning signal lines electrically connected to the first pixel circuits of the first sub-pixels, and
the plurality of gate scanning signal lines comprises a first gate scanning line and a second gate scanning line, the first gate scanning line passes through the optical component arrangement area and is electrically insulated from the second sub-pixels, and an extending direction of the first gate scanning line and an extending direction of the second gate scanning line are identical.

10. The display device according to claim 9, wherein the display panel further comprises a scanning shift register, the scanning shift register comprises a plurality of scanning shift register units that is cascaded, and the plurality of scanning shift register units comprises a first scanning shift unit and a second scanning shift unit;

the first scanning shift unit is electrically connected to the first gate scanning line and is configured to output a first gate scanning signal to the first gate scanning line;

the second scanning shift unit is electrically connected to the second gate scanning line and is configured to output a second gate scanning signal to the second gate scanning line; and a signal intensity of the first gate scanning signal is smaller than a signal intensity of the second gate scanning signal.

11. The display device according to claim 1, wherein the driving current signal output module comprises:

a storage unit configured to pre-store a threshold voltage of a driving transistor in the first pixel circuit;

a second data signal generating unit configured to generate a second data signal based on an image displayed in the optical component arrangement area; and a calculation unit electrically connected to the storage unit, wherein the second data signal generating unit and the second light-emitting element are configured to calculate and output the second driving current signal based on the threshold voltage and the second data signal.

12. The display device according to claim 1, wherein the at least one driving chip comprises:

a first driving chip into which the data signal output module is integrated; and a second driving chip into which the driving current signal output module is integrated.

13. The display device according to claim 12, wherein the non-display area comprises a first non-display area and a second non-display area that are opposite to each other;

the first driving chip is bound to the first non-display area and the second driving chip is bound to the second non-display area; and the optical component arrangement area is located at a side of the display area close to the second non-display area.

14. The display device according to claim 12, further comprising:

an image signal transmitter electrically connected to the data signal output module and the driving current signal output module and configured to generate a first grayscale signal based on an image displayed in the first display area and output the first grayscale signal to the data signal output module, and generate a second grayscale signal based on an image displayed in the optical component arrangement area and output the second grayscale signal to the driving current signal output module, wherein a delay wire is connected between the image signal transmitter and the data signal output module, and the delay wire is used to extend time spent in transmitting the first grayscale signal to the data signal output module.

15. The display device according to claim 14, wherein the delay wire is a bent wire.

16. The display device according to claim 1, wherein the data signal output module and the driving current signal output module are integrated into a same one of the at least one driving chip.

17. The display device according to claim 16, wherein the non-display area comprises a first non-display area and a second non-display area that are opposite to each other;

the at least one driving chip is bound to the first non-display area; and the optical component arrangement area is located at a side of the display area close to the first non-display area.

18. The display device according to claim 1, further comprising:

a camera located in the optical component arrangement area, wherein the second sub-pixels comprise at least one second sub-pixel overlapping with the camera in a direction perpendicular to a plane of the display panel, and the driving current signal output module is further configured to control the least one second sub-pixel not to emit light when the camera is capturing an image.

19. A method for driving the display device according to claim 1, comprising:

providing, by the data signal output module of the at least one driving chip, the first data signal to the first pixel circuit, so that the first pixel circuit drives, in response to the first data signal, the first light-emitting element to emit light; and providing, by the driving current signal output module of the at least one driving chip, the second driving current signal to the second light-emitting element, so that the second light-emitting element emits light in response to the second driving current signal.

20. The method according to claim 19, wherein the plurality of sub-pixels is arranged in a plurality of rows of sub-pixels, each row of the plurality of rows of sub-pixels comprises sub-pixels arranged along a first direction, wherein the display panel further comprises a plurality of light-emitting control signal lines corresponding to the plurality of rows of sub-pixels in one-to-one correspondence, and each of the plurality of light-emitting control signal lines is electrically connected to the first pixel circuits of sub-pixels in a corresponding row of sub-pixels, wherein each of the second sub-pixels further comprises a first switch unit, and the first switch unit is electrically connected to the driving current signal output module, the second light-emitting element, and one of the plurality of light-emitting control signal lines, wherein one of the plurality of light-emitting control signal lines and the second light-emitting element that are electrically connected to a same first switch unit correspond to a same row of sub-pixels of the plurality of rows of sub-pixels, and wherein said providing, by the driving current signal output module, the second driving current signal to the second light-emitting element comprises:

transmitting, by the first switch unit, the second driving current signal output by the driving current signal output module to the second light-emitting element under driving of a light-emitting control signal provided by one of the plurality of light-emitting control signal lines.

21. The method according to claim 19, wherein the at least one driving chip further comprises a light-emitting signal output module, wherein each of the second sub-pixels further comprises a second switch unit electrically connected to the light-emitting signal output module, the driving current signal output module, and the second light-emitting element, and wherein said providing, by the driving current signal output module, the second driving current signal to the second light-emitting element comprises: transmitting, by the second switch unit, under driving of a first light-emitting control signal output by the light-emitting signal output module, the second driving current signal output by the driving current signal output module to the second light-emitting element.

22. The method according to claim 19, further comprising:
- pre-storing, by the driving current signal output module, a threshold voltage of a driving transistor in the first pixel circuit;
- generating, by the driving current signal output module, a second data signal based on an image displayed in the optical component arrangement area; and
- calculating, by the driving current signal output module, the second driving current signal based on the threshold voltage and the second data signal.

23. The method according to claim 19, wherein the display device further comprises: a camera located in the optical component arrangement area,
- wherein the second sub-pixels comprise at least one second sub-pixel overlapping with the camera in a direction perpendicular to a plane of the display panel, and
- the method further comprising: controlling, by the driving current signal output module, the at least one second sub-pixel not to emit light when the camera is capturing an image.

* * * * *